United States Patent [19]

Barber et al.

[11] Patent Number: 4,849,751

[45] Date of Patent: Jul. 18, 1989

[54] CMOS INTEGRATED CIRCUIT DIGITAL CROSSBAR SWITCHING ARRANGEMENT

[75] Inventors: Frank E. Barber, Center Valley, Pa.; Masakazu Shoji, Warren, N.J.

[73] Assignee: American Telephone and Telegraph Company, AT&T Bell Laboratories, Murray Hill, N.J.

[21] Appl. No.: 58,968

[22] Filed: Jun. 8, 1987

[51] Int. Cl.[4] .............................................. H04Q 9/00
[52] U.S. Cl. ............................ 340/825.020; 370/112; 307/243
[58] Field of Search ...................... 340/825.02, 825.03, 340/825.79, 825.8, 825.87, 825.89, 825.91; 370/60, 112; 307/445, 448, 468, 469, 243; 328/104

[56] References Cited

U.S. PATENT DOCUMENTS

| | | | |
|---|---|---|---|
| 3,184,552 | 5/1965 | Macrander | 340/825.02 |
| 3,551,900 | 12/1970 | Annis | 340/825.91 |
| 4,481,623 | 12/1984 | Clark | 340/825.02 |
| 4,593,390 | 6/1986 | Hildebrand et al. | 370/112 |
| 4,698,628 | 10/1987 | Herkert et al. | 340/825.02 |
| 4,716,308 | 12/1987 | Matsuo et al. | |

OTHER PUBLICATIONS

IEEE Journal of Solid State Circuits, vol. SC-10, No. 2, Apr. 1975, pp. 117-122, "Low Power CML IC Crosspoint Switch Matrix for Space Division Digital Switching Networks", by: Manabu Sunazawa et al.
IEEE Journal of Solid-State Circuits, vol. SC-21, No. 5, Oct. 1986, "Elimination of Process-Dependent Clock Skew in CMOS VLSI", by Masakazu Shoji, pp. 875-880.

Primary Examiner—Donald J. Yusko
Assistant Examiner—Edwin C. Holloway, III
Attorney, Agent, or Firm—David I. Caplan

[57] ABSTRACT

A CMOS logic circuit, such as a crossbar digital switch, multistage multiplexer logic tree in a two-column compact folded layout of two columns, each having a width equal to a single stage of the tree, in order to minimize wiring delays and hence signal skew. Each stage of the tree, except for the first, includes a symmetrized two-input CMOS NAND gate followed in cascade by a symmetrized CMOS INVERTER gate, to minimize signal skew otherwise caused by the difference between pull-up and pull-down gate delays of CMOS gates and the skew otherwise caused by variations in semiconductor manufacturing processing conditions and variations in ambient operating conditions (temperature and power supply voltages). Also, a detailed delay balancing scheme separately for pull-up and pull-down gate delays is implemented along a pair of signal paths for generating each output signal and its simultaneous complement without relative skew between them. In this way a single-chip 64 input×17 output CMOS digital crossbar switch can be made to operate with date rates as high as 300 megabits per second.

14 Claims, 5 Drawing Sheets

CMOS INTEGRATED CIRCUIT DIGITAL CROSSBAR SWITCHING ARRANGEMENT

FIELD OF THE INVENTION

This invention relates to integrated circuits and more particularly to digital logic circuits for implementing a crossbar (crosspoint) switch in a telecommunication system for enabling each subscriber of the system to select from among one or more than one other subscriber to transmit to them digitally encoded information for voice, video or data transmission.

BACKGROUND OF THE INVENTION

Crossbar (crosspoint) switches for digital signal transmission in prior art have used as a switching element at each crosspoint such passive (signal nonregenerative) switching elements as metallic switches and gated diode switches. Where such switches are used for switching digital signals having the relatively high digital signal transmission rates of over about 50 to 100 megabits per second, clock recovery and reconstruction of signal become difficult if not impossible, because of signal deterioration caused by various parasitics of these passive switches. More specifically, the relatively long interconnecting wires, necessitated by the relatively large size of each such switching element, and the relatively high parasitics of series resistance and parallel capacitance, both of the interconnecting wires and of the switching elements themselves, result in both lumped and transmission line parasitics which produce undesirable delays and distortion in the digital signals propagating through the crossbar switch. Thus, unwanted delays in the propagation times and deteriorations of the waveforms of these signals result. In particular, the amplitudes of digital signal pulses are reduced and the pulse edges thereof become diffuse. Moreover, these delays are different for upward vs. downward going input signal pulse edges and for each signal vs. its complement (inverse), and in general are also different for different subscribers transmitting signals to a given subscriber at different times or for a given subscriber transmitting signals to various other subscribers at the same time. That is to say, these delays cause all sorts of signal skew, the term "skew" being used herein to include not only discrepancies and variations in delays and widths of each signal pulse as compared with its complement but also pulse width and amplitude distortion of a single signal pulse. Accordingly, clock (timing) recovery and reconstruction of the original signals after propagating through the crossbar switch become difficult if not impossible at the above-mentioned high data rates.

On the other hand, the use of active (regenerative) switching elements that are interconnected to form a multiplicity of cascaded stages of logic gates in a logic circuit arrangement has been suggested in a paper by M. Sunazawa et al. published in *IEEE Journal of solid-State Circuits*, Vol. SC-10, pages 117-122 (1975) entitled "Low Power CML IC Crosspoint Switch Matrix for space Division Digital Switching Networks." In that circuit, in order to avoid skew, bipolar transistors were used as the switching elements in emitter coupled logic (ECL) in which the switching delay times of each of the cascaded logic gates formed by the transistors were much less than the pulse widths of the digital signals propagating therethrough. For data rates in the range of 100 to 300 megabits per second, for example—i.e., pulse widths in the range of 10 to 3 nanoseconds, a total signal skew of as little as about 2 to 0.6 nanoseconds is required to recover the clock signal. That is, the allowed variation in pulse width is only about one-fifth the pulse width or less—after propagation of the signal through the multiplicity of cascaded stages of gates. To achieve this objective using conventional circuit designs, a delay per logic gate of about 0.3 to 0.1 nanoseconds is desirable—i.e., a delay per gate of about one-sixth the total skew in such an arrangement. However, although bipolar transistor technology can satisfy these requirements in theory, nevertheless the size of bipolar logic gates is so large (because of the need for isolating individual bipolar transistors), and the standby power and heat dissipation problems are so great, that in practice it is unduly complex, difficult (if at all possible), and costly to manufacture a crossbar switching arrangement as large as 64 input × 17 output in bipolar technology, especially in a single silicon semiconductor chip. On the other hand, CMOS technology does not suffer from the large gate size and power dissipation problem of bipolar technology but suffers from a longer gate delay per logic gate, in the range of about 0.6 to 1.2 nanoseconds. Therefore, CMOS technology would be a good substitute for bipolar technology in a crossbar switching arrangement if a novel design strategy could be found to enable a CMOS crossbar switching arrangement to handle data rates as high as 100 megabits per second or more in a 64 × 17 crossbar switch, for example.

In CMOS (complementary MOS) technology, as known in the art, each CMOS logic gate comprises one or more p-channel MOS field effect transistors (PFETs), located in a PMOS portion of the gate interconnected between a VDD power line and an output node (terminal) of the gate, and one or more n-channel MOS field effect transistors(NFETs), located in an NMOS portion of the gate interconnected between a VSS power line and the output node of the gate. The PFETs and NFETs are interconnected in such a manner that whenever the input signals to the PFETs and NFETs are such that there is closed path from VDD through the PMOS portion to the output node, so that the voltage at the output node goes up to VDD (pulls up), there is then no closed path from the output node to VSS, so that there is no standby power dissipation. Similarly, there is no standby power dissipation when the voltage of the output node goes down (pulls down) to VSS as a result of a closed path being formed through the NMOS portion but not through the PMOS portion.

On the other hand, CMOS logic circuits suffers from signal skews caused by differences between pull-up and pull-down delays in CMOS logic gates more strongly than the faster bipolar ECL gates. This is a general problem when using slower gates in highly precise timing. Faster ECL gates make the skew invisible by virtue of the speed of switching, but slower CMOS gates cannot do so. These differences vary with variations in semiconductor manufacturing processing conditions, as well as with variations in operating power line voltages (VDD and VSS) and operating temperatures. Moreover, interconnecting wiring delays, caused by differences in relatively long lengths of the interconnecting wiring, also produce signal skews in CMOS multistage logic tree circuits. Therefore, it would be desirable to have a CMOS switching circuit arrangement which avoids all these signal skews.

SUMMARY OF THE INVENTION

An integrated circuit digital crossbar switching circuit arrangement, for example, that can be as large as 64 input×17 output, and can handle data rates of 100 megabits per second or more with substantially zero signal skew, can be achieved in static CMOS logic circuitry by:

(a) stage-to-stage signal skew cancellation—by means of cascading symmetrized CMOS NAND and CMOS INVERTER logic gates;

(b) compensation of skew caused by variations in semiconductor manufacturing conditions, in ambient temperature, and in power supply—by means of a detailed delay-balancing scheme separately for pull-up and for pull-down CMOS gate delays along each pair of signal paths for generating the simultaneous (i.e., zero-skew or no-skew) complement of each logic signal; and (c) a compact folded layout of a fan-in CMOS multiplexer multistage logic tree scheme that minimizes delays in the interconnecting wiring, and hence minimizes the signal skew arising from such delays, and at the same time economizes on semiconductor area.

By a CMOS NAND gate being "symmetrized" it is meant, for example, that instead of just two series-connected NFETs in the NMOS portion of a two-input CMOS NAND gate, as in the conventional CMOS NAND gate 10 shown in FIG. 2, there are two parallel pairs of series-connected NFETs, each NFET in each pair receiving one of two input signals, say X and Y, in the opposite order of spatial sequence in the direction going from the VSS power line toward the output node of the gate, as indicated in the symmetrized NAND gate 100 shown in FIG. 1. By a CMOS INVERTER gate being "symmetrized" it is meant that instead of a single PFET connected in series with a single NFET, as in the conventional CMOS INVERTER gate 20 shown in FIG. 2, there are two parallel PFETs and two parallel pairs of series-connected NFETs, with one input being any arbitrary signal (such as, say, the output signal W of the NAND gate 100) the inverse of which is desired from the INVERTER gate, and the other input being the steady d.c. voltage of the conventional CMOS power line VDD, all as indicated by the symmetrized CMOS INVERTER gate 200 shown in FIG. 1.

By using the term "detailed delay balancing" for the CMOS gate delays along a pair of signal paths for generating the simultaneous (no-skew) complement of each signal, it is meant that, in response to either an upward pulse edge input or to a downward pulse edge input, the sum of the pull-up delays in each of the two paths are made equal, in addition to the total sum of the pull-up plus pull-down delays in the two paths being made equal, as described more fully in a paper by M. Shoji, one of the inventors herein, entitled "Elimination of Process-Dependent Clock Skew in CMOS VLSI," published in the *IEEE Journal of Solid State Physics*, Vol. SC-21, pages 875–880 (Oct. 1986).

By using the term "compact folded layout" of a fan-in CMOS multiplexer multistage logic tree it is meant that cascaded CMOS NAND and CMOS INVERTER gates in a multiplexer logic tree are folded into and compactly arranged in an X-Y plane (i.e., the plane of the major surface of the semiconductor chip in which the circuit is integrated) in at least two columns—e.g., 301 and 302, as indicated in FIG. 4. All columns run along the Y direction. One of the columns (e.g., 301) contains all the NAND gates of the first stage of the tree, arranged so that all information signals propagate through these NAND gates in the +X direction (i.e., from left to right). The other of the columns (e.g., 302) contains all of the NAND gates plus INVERTER gates of all the remaining stages, arranged so that all information signals propagate through the NAND gates of all the remaining even-numbered stages (i.e., of the second stage, the fourth stage, etc.) likewise in the +X direction, and so that all information signals propagate through the NAND gates of all the remaining odd-numbered stages (i.e., in the third stage, the fifth stage, etc.) in the −X direction (i.e., from right to left). In another embodiment (FIG. 6) of the compact folded layout scheme of the invention there are three columns: the added column, containing the NAND gates plus INVERTER gates of the second stage, being inserted between the other two columns in order to achieve a layout which is transistor device intensive rather than wiring intensive.

The compact folded layout scheme reduces parasitic capacitance loading on the transistor drive elements, whereby skew-free high speed operation (over 200 megabits per second) can be achieved using 1.25 micron CMOS technology in a 64 input×17 output crosspoint switch integrated on a single silicon chip.

BRIEF DESCRIPTION OF THE DRAWING

This invention together with its features, advantages, and characteristics may be better understood from the following detailed description when read in conjunction with the drawings in which.

DETAILED DESCRIPTION

Figure 1:
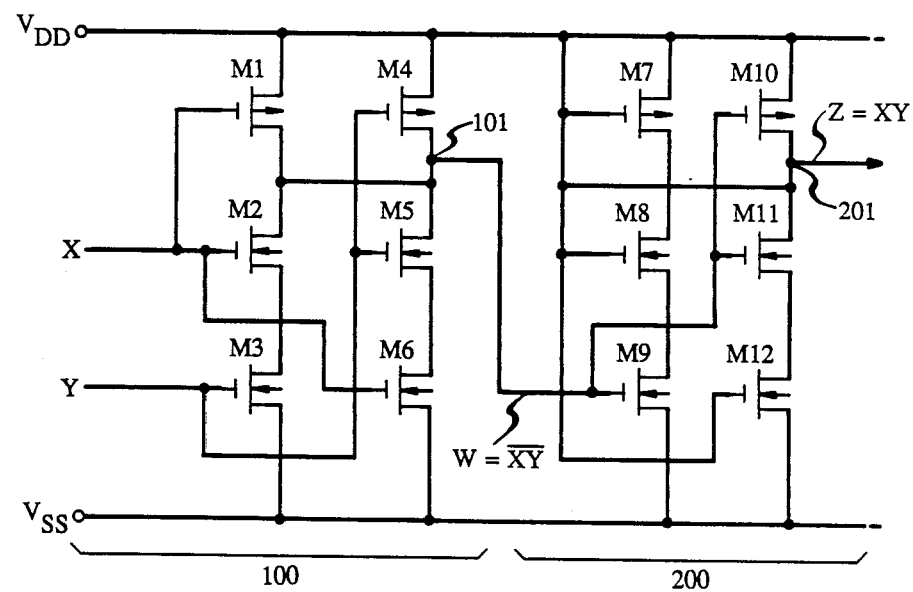
FIG. 1 is a schematic diagram of a symmetrized static CMOS NAND gate in cascade with a symmetrized CMOS INVERTER gate in accordance with a specific embodiment of the invention.

As shown in FIG. 1, a symmetrized static CMOS NAND gate 100 produces an output signal $W=\overline{XY}$ in response to input signals X and Y, the bar symbol written above XY indicating the logical inverse function thereof. In turn, the output signal W generated at output node 101 of the symmetrized NAND gate 100 is delivered as an input signal to a symmetrized static CMOS INVERTER gate 200, whereby an output Z=XY is generated at output node 201 of the INVERTER gate 200. Each of the gates 100 and 200 contains a PFET (p-channel MOS transistor) portion and an NFET (n-channel MOS transistor) portion connected in series between a conventional pair of d.c. power lines VDD and VSS.

The NFET portion of the static CMOS NAND gate 100 is composed of two parallel branches each of which is connected between the output node 101 and the d.c. power line VSS. One of the branches is formed by a series-connected pair of NFETs M2 and M3. The other of the branches is formed by a series-connected pair of NFETs M5 and M6. The input signal X is applied to the gate terminals of PFET M1 and NFETs M2 and M6, whereas the input signal Y is applied to the gate terminals of NFETs M3 and M5 and of PFET M4. Thus the gate 100 is symmetrized in the sense, at least in part, that each of the input signals X and Y is applied to the gate terminals of two separate NFETs M2, M6 and M3, M5, respectively: X is applied to M2 and M6 while Y is applied to M3 and M5, characterized in that one of the NFETs to which X is applied, i.e., M6, has its source terminal directly connected to the power line VSS, and one of the NFETs to which Y is applied i.e., M3, likewise has its source terminal directly connected to the power line VSS. In addition, the other one of the NFETs to which X is applied, i.e., M2, has its source terminal directly connected to the drain terminal of M3, and the other of the NFETs to which Y is applied, i.e., M5, has its source terminal directly connected to the drain terminal of M6.

The INVERTER gate 200 (FIG. 1) is symmetrized in the same way as the NAND gate 100 was symmetrized by substituting the transistors M7, M8, M9, M10, M11, and M12, respectively, for the transistors M1, M2, M3, M4, M5, and M6; and at the same time using as input signals for the INVERTER gate 200 the d.c. voltage of the power line VDD and the signal W, respectively, instead of the input signals X and Y used for the NAND gate 100.

The importance of symmetrizing the NAND gate 100, as well as symmetrizing the INVERTER gate 200, can be appreciated first by contrasting the operation of the NAND gate 100 (FIG. 1) with that of conventional NAND gate 10 (FIG. 2) in response to input signal pulse edges—i.e., signal transitions from one logic level to another within a time interval that is preferably shorter than a gate delay, and in any event is not longer than about three times a gate delay. Suppose in FIG. 2 that Y is and remains at a logic high level while X makes a logic high to low transition—i.e., a downward going pulse edge in X; then PFET M1 pulls up W at output node 11 to logic high, and accordingly NFET M11 pulls down Z at output node 21 to logic low. In thus pulling down the output Z, but a single PFET, M1, and a single NFET, M11, are involved in the delay over the two stages of gates formed by the NAND gate 10 plus the INVERTER gate 20. Next, suppose that X makes low to high transition—i.e., an upward going pulse edge in X—while Y still remains at the logic high level; then the series-connected NFETs M2 and M3 pull-down W to logic low and a single PFET M10 pulls up Z to logic high. In this pulling up Z, two NFETs, M2 and M3, and single PFET, M10, are involved. Since the numbers of FETs involved in thus pulling up vs. pulling down Z, the delays are different. The resulting difference in the pull-up vs. pull-down delay causes undesirable skew.

This skew, as well as skew (if any) caused by differing pull-down delays of X vs. Y in the NFET portion of the NAND gate 10, can be reduced virtually to zero by using the symmetrized INVERTER gate 200 (FIG. 1), in which one of the inputs is permanently supplied by the VDD power line, connected in cascade with the symmetrized NAND gate 100.

In the symmetrized gates 100 and 200, all NFETs (M2, M3, M5, M6, M8, M9, M11 and M12) typically have substantially mutually identical structures in terms of their dimensions (channel length, channel width, gate oxide thickness), and all PFETs (M1, M4, M7, and M10) typically have mutually identical symmetrized structures. Thus, because of the symmetry of the gates 100 and 200 with respect to inputs X and Y, the delays in both gates are the same whether X makes a transition in the presence of a given Y, or Y makes a transition in the presence of a given X. Preferably these respective dimensions of the PFETs and NFETs are selected such that the pull-up delay of each gate is approximately equal to its pull-down delay, i.e., to within a few percent or less, under a given standard set of semiconductor manufacturing processing conditions—it being understood that variations in NFET vs. PFET processing conditions can vary this approximate equality of the pull-up and pull-down delays, especially in cases where the PFET processing conditions vary in such a manner as to speed up the switching delays of the PFETs and hence the pull-up delays of the gates, while the NFET processing conditions vary in such a manner as to slow down switching delays of the NFETs and hence the pull-down delays of the gates. Moreover, in any event advantageously each of the transistors in the INVERTER gate 200 is made to be of identical structure as its corresponding transistor in the NAND gate 100—i.e., M1=M7, M2=M8, M3=M9, . . . , M6=M12. Therefore, the pull-down delays—say t and t′, respectively—of the gates 100 and 200 will be equal, i.e., t=t′; and the pull-up delays—say T and T′, respectively—of these gates 100 and 200 will be equal, i.e., T=T′. Accordingly t+T′=T+t′. Thus, in response to an *upward* going signal pulse edge of say X in the presence of a high logic level of Y (or of Y in the presence of a high level of X), the gate 100 pulls down W after a delay equal to t and the gate 200 pulls up Z after a further delay equal to T′, for a total delay through gates 100 plus 200 of t+T′; and in response a *downward* going signal pulse edge of say X in the presence of a low logic level of Y (or of Y in the presence of a low level of X), the gate 100 pulls up W after a delay equal to T and the gate 200 pulls down Z after a further delay equal to t′, for a total delay of T+t′. But, since t+T′=T+t′, it follows that the total delay through gates 100 plus 200 for *upward* input transitions of X (or Y) is the same as for *downward* input transitions of X (or Y), and hence pulse widths (upward edge to downward edge) are preserved for signals propagating through gates 100 plus 200. That is, signal skew (pulse width distortion) is eliminated; while signal amplitude as known in the art is regenerated by these gates 100 and 200, simple because they are CMOS gates.

Moreover, this elimination of signal skew will be preserved even under variations in semiconductor manufacturing processing conditions and parameters, that vary differently for PFETs vs. NFETs, as is commonly encountered because NFETs and PFETs are processed at different times during their respective manufacture. Also, variations in operating conditions, such as temperature, can affect PFETs differently from NFETs, and yet the elimination of signal skew will be preserved by the symmetrized gates 100 plus 200, as can be seen from the following analysis.

Figure 3:
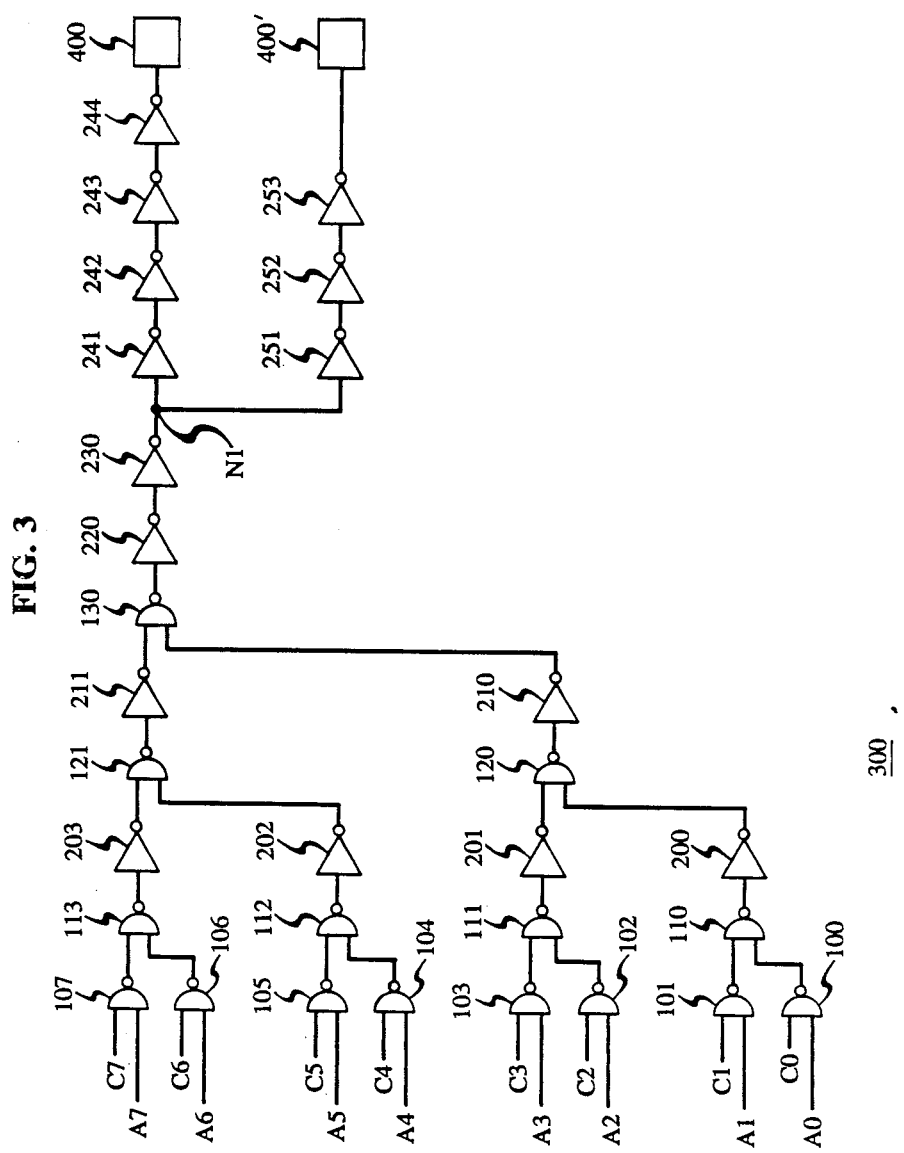
FIG. 3 is a schematic diagram of an eight-input fan-in CMOS multiplexer logic tree using symmetrized static CMOS NAND and symmetrized static CMOS INVERTER gates, together with a detailed balancing scheme for pull-up and pull-down delays for producing an output signal and its complement without skew, in accordance with another embodiment of the invention.

Assume that the parameters of the PFETs and NFETs change, for any reason, such that the delays associated with NFETs—i.e., the pull-down delays $t$ and $t'$—are all multiplied by a factor $f$ which may be either greater than or less than unity; and at the same time the delays associated with PFETs—i.e., the pull-up delays $T$ and $T'$—are all multiplied by a factor $g$ which may be either greater than or less than unity independently of the factor $f$. Thus the original delays $t$, $t'$, $T$, and $T'$ become $ft$, $ft'$, $gT$, and $gT'$, respectively, under these variations. But, because $t=t'$ and $T=T'$, therefore $ft=ft'$ and $gT=gT'$, so that it follows that $ft+gT'=gT+ft'$. Accordingly, again the pulse width is still preserved by a signal pulse (upward-going edge followed by downward-going edge, or vice versa) propagating through gates 100 plus 200, despite the differing variations ($f$ and $g$) in NFETs and PFETs. As shown in FIG. 3, a fan-in multiplexer logic tree 300 includes a first multiplexer stage having a total of eight NAND gates 100, 101, 102, . . . 107 in pairs which fan-in to a second multiplexer stage comprising a total of four NAND gates 110, 111, 112, 113, each cascaded in series with an INVERTER gate 200, 201, 202, 203, respectively. In turn, these four INVERTER gates in pairs fan-in to a third multiplexer stage comprising a total of two NAND gates 120 and 121, each cascaded in series with an INVERTER gate 210 and 211, respectively. Further, these latter two INVERTER gates in pairs fan-in to a fourth multiplexer stage comprising multiplexer 130 cascaded in series with INVERTER gates 220 and 230 to node N1. Moreover, the node N1 is connected to a pair of parallel paths to first path containing cascaded INVERTER gates 241, 242, 243, 244, terminating in a first output pad 400, and the second path containing cascaded INVERTER gates 251, 252, 253 terminating in a second output pad 400' which thus supplies the complementary information signal to that developed at the first output pad 400, there being one more inverter in first such path than in the second.

To minimize skew, as discussed above in connection with FIG. 1, each of the NAND gates is symmetrized and each of the INVERTER gates likewise is symmetrized, except that the INVERTER gates in the first and second paths from node N1 to the output pads 400 and 400', respectively, generally are not symmetrized, since none of these INVERTER gates is immediately preceded by a NAND gate that would require compensation by symmetrization. On the other hand, the transistors in the INVERTER gates in the first and second paths are selected to have channel widths such that, in response to an *upward*-going signal edge at the node N1, the sum of the resulting pull-*up* delays in the first and second paths are made to be equal, and at the same time the sum of the resulting pull-*down* delays in these paths are also made to be equal—i.e., the sum of the resulting pull-*up* delays of INVERTER gates 242 plus 244 is equal to the resulting pull-*up* delay of the INVERTER gate 252, and moreover at the same time in response to this *upward*-going signal edge at the node N1 the sum of the resulting pull-*down* delays of the INVERTER gates 241 plus 243 is equal to the sum of the resulting pull-*down* delays of the INVERTER gates 251 plus 253. Similarly, in response to a *downward*-going signal edge at the node N1, the sum of the resulting pull-*up* delays of the INVERTER gates 241 plus 243 is made equal to the sum of the resulting pull-*up* delays of INVERTER gates 251 plus 253, and the sum of the pull-*down* delays of INVERTER gates 242 plus 244 is made equal to the sum of the resulting pull-down delay of the INVERTER gate 252. In this connection, it should be remembered that in any CMOS gate, the NMOS portion pulls-*down* the output of the gate in response to an *upward*-going input, whereas the PMOS portion pull *up* the output of the gate in response to a *downward*-going input.

It is important that the CMOS NAND gates 110, 111, 112, 113 (in the second stage of the logic tree) be symmetrized, and that the CMOS INVERTER gates 200, 201, 202, and 203 (in such second stage) also be symmetrized—that is, be structured in accordance with the above described symmetrized CMOS NAND and symmetrized CMOS INVERTER gates 100 and 200 as described above. Likewise it is important that the CMOS NAND gates 120, 121 and the CMOS INVERTER gates 210 and 211 in the third stage be symmetrized, and that the CMOS NAND gate 130 and the CMOS INVERTER gate 220 in the fourth stage be symmetrized. In this way, skews will not accumulate over a multiplicity of stages. It is further desirable, though not crucial, that the CMOS NAND gates 100, 101, 102, . . . 107 (in the first stage) by symmetrized.

As further shown in FIG. 3, a total of eight input pulsed information signals A0, A1, A2, . . . A7 are controlled by a total of eight control signals C0, C1, C2, . . . C7, respectively. A any instant of time at most one of these control signals is at the logic high level and hence at most one of the NAND gates 100, 101, 102, . . . 107, respectively, is enabled, i.e., enables the corresponding one of the information signals to propagate through that one of NAND gates. For example, if control signal C2 is high and the remaining control signals are low, then A2 and only A2 propagates (as $\overline{A2}$) to the next stage of multiplexer, i.e., propagates to the NAND gate 111 in the second stage of the tree. Since all other control signals, including C3 in particular, are thus then low, the output of the NAND gate 103 will be high and hence will enable the NAND gate 111 to pass along the signal $\overline{A2}$ to the INVERTER gate 201, and then to pass along the resulting signal A2 to the NAND gate 120 in the third stage, and so forth through the remaining fourth stage (or still further stages, if any). Thus the input information signal A2, and no other, can propagate all the way to the output pads 400 and 400' as output information signals A2 and $\overline{A2}$, respectively, if and when C2 is high. Similarly, any one of the other input information signals can propagate to and arrive as an output information signal and it complement at the output pads 400 and 400', respectively, if and when that other signal's corresponding control signal is high.

Figure 4:
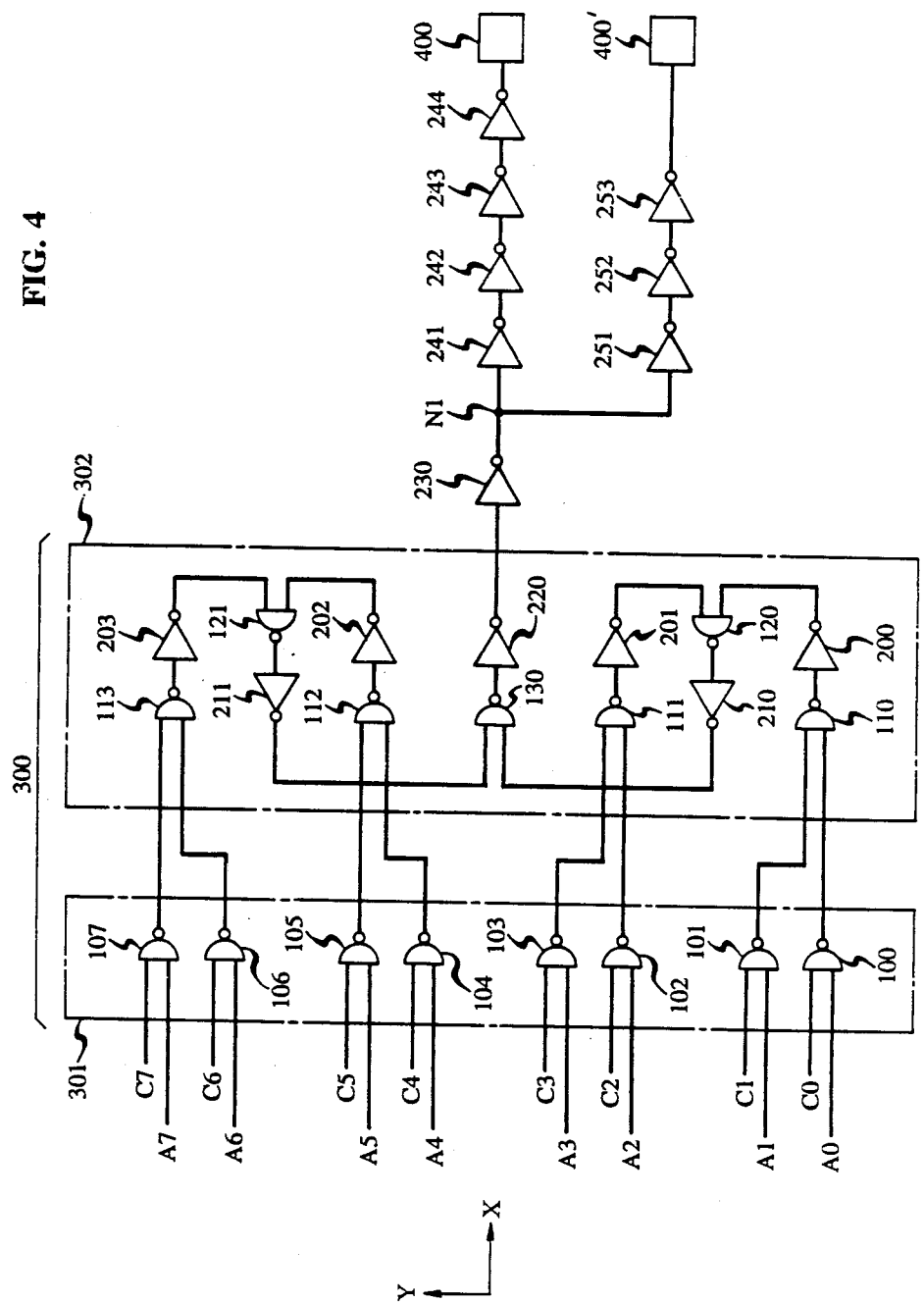
FIG. 4 is a schematic diagram of a compact folded layout of the eight-information-signal-input CMOS multiplexer logic tree in accordance with another embodiment of the invention, together with the detailed balancing scheme for pull-up and pull-down delays for producing an output signal and its complement without skew.

As shown in FIG. 4, the previously described fan-in multiplexer logic tree 300 is folded into a compact folded layout scheme in the XY plane (major surface of semiconductor chip). The layout consists essentially of first and second interconnected columns 301 and 302, respectively, in order to minimize signal skews caused by interconnection wiring delays and at the same time economize on semiconductor chip area. The first column 301 contains the first stage and only the first stage of the multiplexer logic tree, consisting essentially of the NAND gates 100, 101, 102, . . . 107; whereas the second column 302 contains all the remaining stages of the logic tree. It should be noted that in case the first stage is designed to receive more than just $8(=2^3)$ information signal inputs but instead is designed to receive say $2^n$ information signal inputs (n=integer), then the first column will contain $2^n$ NAND gates, and the second column will contain $2^n-1$ symmetrized NAND gates each of which has its output terminal connected to the input terminal of a corresponding symmetrized INVERTER gate—i.e., similarly to the way the second column 302 is constructed as shown in FIG. 4—plus a final INVERTER gate similar to the INVERTER gate 230 in the second column 302. In other words, each stage (except the first) consists essentially of half as many symmetrized CMOS NAND gates as the stage immediately proceding it plus a symmetrized CMOS INVERTER gate in cascade with each such NAND gate, and there are a total of (n+1) stages. Note that in layout of the logic tree 300 the first and second columns 301 and 302, respectively, both run along parallel to the Y direction: i.e., both of these columns may be viewed as running either in the +Y or the −Y direction. On the other hand, in the first column 301, where all gates of the first stage are located, all the information signals propagate through all the gates in the +X direction— that is, from left to right; whereas, in the second column 302, where all the gates of the remaining second, third, and fourth stages are located, the information signals propagating in the even-numbered (second and fourth) stages propagate in +X direction (i.e., from left to right), while the information signals propagating in the odd-numbered (third) stage propagate in the −X direction (i.e., from right to left). Moreover, in case there are more than just eight inputs, the layout scheme, still having but two columns as mentioned above, will have the property that in the first column—i.e., in the first stage of the logic tree—all the NAND gates are still arranged so as to propagate the information signals in the +X direction (i.e., from left to right); and in the second column—i.e., in all the remaining stages of the logic tree—all the NAND gates in the even-numbered stages (i.e., in the second stage, the fourth stage, etc.) are arranged so as to propagate the information signals likewise in the +X direction (i.e., from left to right), while all the NAND gates in the remaining odd-numbered stages (i.e., in the third stage, the fifth stage, etc.) are arranged so as to propagate the information signals in the −X direction (i.e., from right to left). Note also that at any location in the Y direction the first column 301 has a width (in the X direction) of only one logic gate, i.e., is one NAND gate wide; whereas the second column is at most two logic gates wide, i.e., a symmetrized NAND gate connected in cascade with a symmetrized INVERTER gate.

Advantageously, all the NAND gates 100, 101, ... 107 in column 301 are mutually identical, and in column 302 all the NAND plus INVERTER gate cascades are mutually identical. In this way the electrical path length, including both wiring and gate delays, from each input A0, A1, ... A7 to the node N1 is the same for all. Thus, when switching the logic high level from one of the control signals C0, C1, C2, ... C7, to another, the corresponding information signals arrive at node N1 in a correlated manner. For example, if initially C2=1, C6+0 and immediately thereafter C2=0, C6=1, then at the node N1 the trailing edge of the arriving information pulses corresponding to the information signal A2 will immediately be followed by the leading edge of the arriving information pulses corresponding to the information stream A6 without undesirable overlap or delay therebetween.

Figure 5:
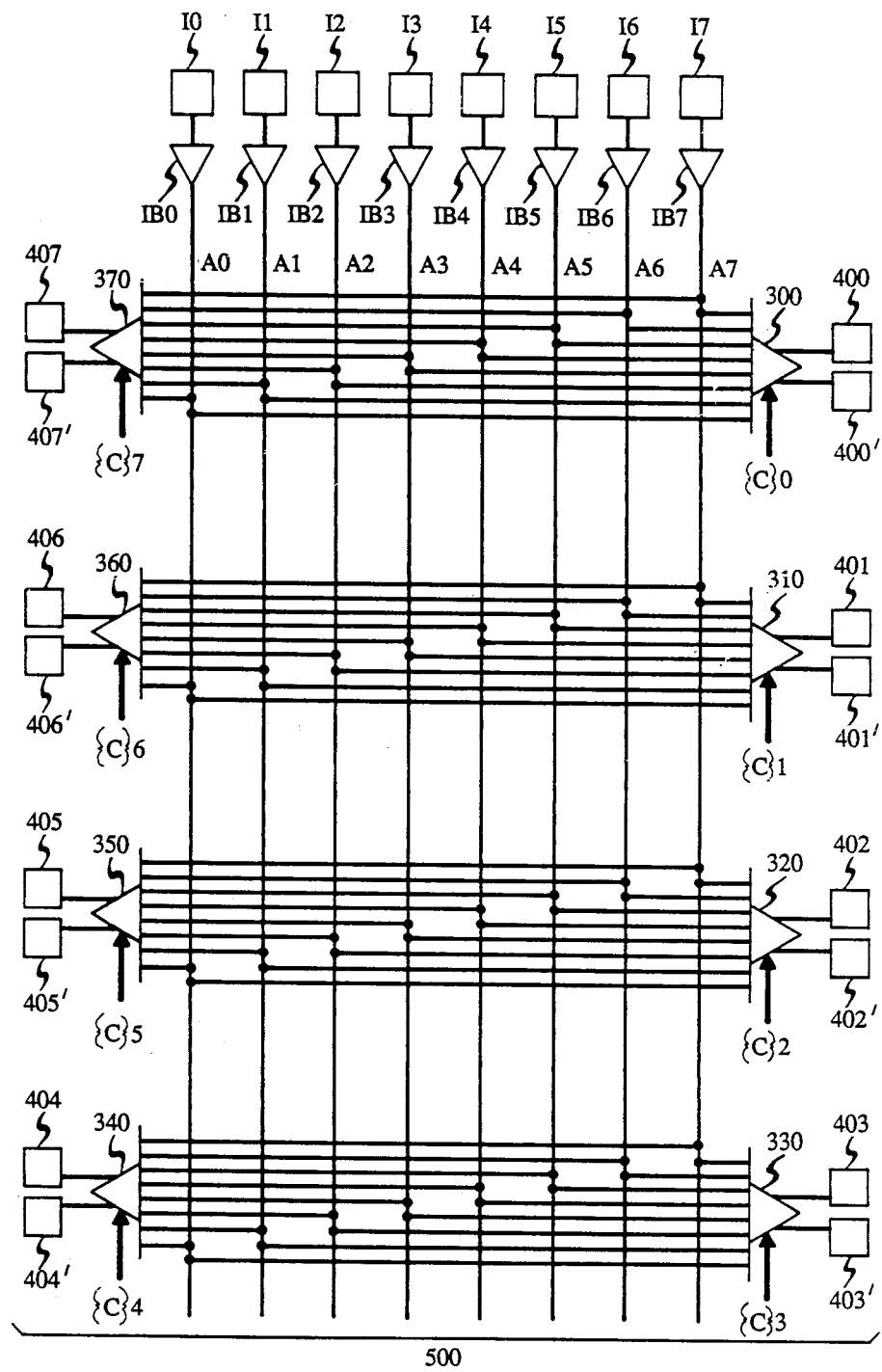
FIG. 5 is a diagram of a CMOS integrated circuit digital crossbar switching arrangement, in accordance with another embodiment the invention.

FIG. 5 shows an 8 input ×8 output CMOS crossbar switching arrangement 500 comprising eight input signal pads I0, I1, I2, ... 17, for receiving eight input information signals; eight input buffers IB0, IB1, IB2, ... IB7 for developing proper signal levels for the eight input information signals A0, A1, ... A7; eight multiplexer logic trees 300, 310, 320, ... 370, each constructed in accordance with the compact folded layout 300 consisting of first and second columns 301 and 302 shown in FIG. 4 together with first and second signal paths (not shown in detail) for developing eight output information signals and their complements at output pads 400, 400', 401, 401', ... 407, 407'. In addition, there are $8\times8=64$ control signals. A first set of eight of them, designated by {C}0, is delivered to the first stage of logic tree 300, just as C0, C1, ... C7, as previously described—i.e., {C}0 is the set formed by C0, C1, ... C7. A second set of eight of them, designated by {C}1, is similarly delivered to the first stage of a second logic tree 310; and so forth, until finally an eight set of eight control signals {C}7 is similarly delivered to the first stage of an eight logic tree 370. Note that each of the input information signals A0, A1, ... A7 is connected as an input to the first stages of all the trees 300, 310, ... 370.

It should be understood that the arrangement 500 can be expanded from an 8 input×8 output to a 64 input×17 output (or more) crossbar switching arrangement integrated in a single silicon ship simply by having a total of 64 input pads, a total of 64 input buffers, a total of 17 multiplexer logic trees, each of the trees having a first stage consisting essentially of a total of 64 ($=2^6$) CMOS NAND gates, and a total of six further stages each of which consists essentially of half as many symmetrized CMOS NAND gates (plus an INVERTER gate in cascade with each such NAND gate) as the stage immediately preceding it. In this way, a 64 input×17 CMOS crossbar switch has been fabricated in a single silicon chip with a minimum feature size of about 1.25 microns and has been successfully tested and operated at data rates as high as 280 megabits per second.

Figure 6:
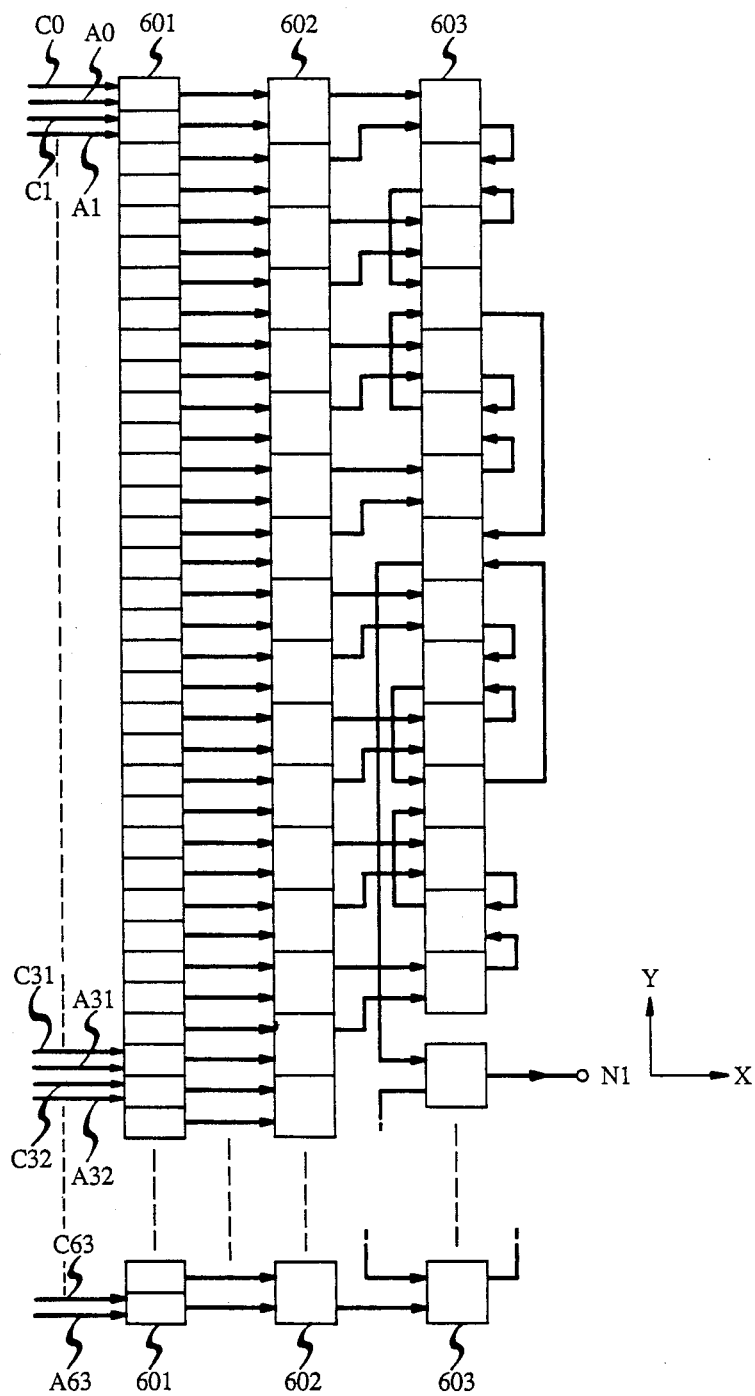
FIG. 6 is a block diagram of a compact folded layout of a sixty-four-information-signal input CMOS multiplexer logic tree in accordance with yet another embodiment of the invention.

A compact folded layout for such a 64 input crossbar switching arrangement is shown in FIG. 6, wherein each box in column 601 represents a single NAND gate, and each box in columns 602 and 603 represents a symmetrized CMOS NAND gate plus an INVERTER gate in cascade therewith, the structure of each such column for positive values of Y being a mirror image of the structure of such column for negative values of Y.

It should be noted that the arrangement 500 enables any input signal to be delivered simultaneously (i.e., to be broadcast) to as many output pads as desired, depending upon the control signals. Note further, that at any instant of time at most one of the first set {C}0 of control signals should be high, plus (if desired) at most one of the second set {C}1, etc. lest more than one of the input signals be delivered to the same output pad at the same time and thereby cause undesired confusion.

It should be understood that ultimately each of the input pads and each of the output pads in the arrangement 500 ultimately is connected to a subscriber (not shown) in a telecommunication system, either through further electronic means or through electro-optic and optical means, or both, as known in the art.

Figure 2:
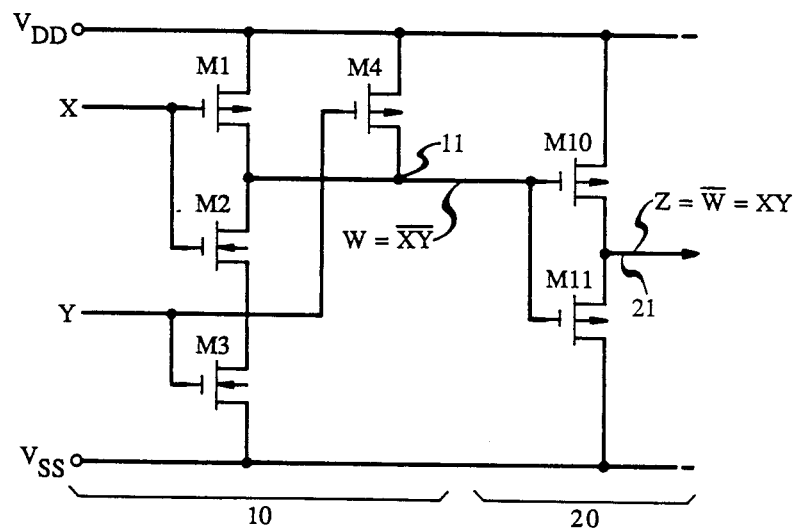
FIG. 2 is a schematic diagram of a static CMOS NAND gate in cascade with a CMOS INVERTER gate in accordance with prior art.

Although the invention has been described in terms of specific embodiments, various modifications can be made without departing from the scope of the invention. For example, instead of symmetrized CMOS NAND gates, symmetrized CMOS NOR gates can be made from conventional CMOS NOR gates by adding PFETs in the PMOS portion in similar manner as shown in FIG. 2 for adding NFETs in the NMOS portion of a conventional CMOS NAND gate.

More generally, by a "symmetrized" CMOS logic gate it is meant that going from one of the power lines to the output node of the gate, either through the NMOS portion or through the CMOS portion, there are n! (n-factorial) parallel paths, where n is the number of inputs, and in each of these paths there are n separate series-connected FETs to which the inputs are applied in a different order (permutation) of transistor sequence going from the corresponding one of the power lines to the output node.

What is claimed is:

1. A CMOS integrated circuit digital crossbar switching arrangement comprising:
  (a) a multistage fan-in multiplexer logic tree, each stage after the first stage comprising a CMOS NAND gate connected in cascade with, to deliver output to, a CMOS INVERTER gate, the first stage comprising a CMOS NAND gate, where each of the NAND gates and each of the INVERTER gates includes:
    a first electrical path from a first power line to an output node of the gate, the path consisting essentially of first and second serially-connnected FETs in spatial order of sequence going from the first power line to the output node; and
    a second electrical path from the first power line to the output node, the second path consisting essentially of third and fourth serially-connected FETs in spatial order of sequence going from the first power line to the output node;
    the first and fourth FETs having their gate electrodes connected in common to a first input terminal for receiving a first input, and the second and third FETs having their gate electrodes each connected in common to a second input terminal for receiving a second input; and
  (b) means, responsive to an output signal of the logic tree, for supplying a skew-free complement of the output signal, such means including first and second signal paths each containing a different plurality of cascaded CMOS INVERTER gates, the channel widths of the INVERTER gates of the first and second paths being such that in response both to an upward-going input signal edge and to a downward-going input signal edge applied to the first and second signal paths the sum of the pull-up delays along the first path is equal to the sum of pull-up delays along the second path; whereby the output signal of said means and its complement remain skew-free under variations in semiconductor manufacturing processing conditions or under variations in operating conditions.

2. A tele-communication system including the switching arrangement of claim 1.

3. The arrangement of claim 1 in which the logic tree is arranged in a layout comprising at least two columns of interconnected CMOS gates, one of the columns consisting essentially of the first stage of the tree including a first plurality of said NAND gates each connected for receiving an input information signal and a control signal, and another of the columns consisting essentially of a plurality of remaining stages of the tree.

4. The arrangement of claim 3 in which
  (a) the layout is in an XY plane with the columns parallel to the Y direction;
  (b) said one of the columns has a width in the X direction of one of said NAND gates each of which propogates signals in the +X direction; and
  (c) said another of the columns has a width of one said NAND gate in cascade with one said INVERTER gate, and all the gates therein of even-numbered or odd-numbered stages, respectively, propagate signals in the +X direction, and all the gates therein of odd-numbered or even-numbered stages, respectively, propogate signals in the −X direction.

5. The arrangement of claim 1 in which the logic tree is arranged in a layout comprising two columns of interconnected CMOS gates, one of the columns consisting essentially of the first stage of the tree including a first plurality of said NAND gates each connected for receiving an input information signal and a control signal, and another of the columns consisting essentially of a plurality of remaining stages of the tree.

6. A tele-communication system including the arrangement of claim 5.

7. The arrangement of claim 5 in which
  (a) the layout is in an XY plane with the columns parallel to the Y direction:
  (b) said one of the columns has a width in the X direction of one of such NAND gates each of which propagates signals in the +X direction:
  (c) said another of the columns has a width of one said NAND gate in cascade with one said INVERTER gate, and all the gates therein of even-numbered or odd-numbered stages, respectively, propogate signals in the +X direction; and
  (d) a third column connected interveningly between the one and the other of the columns, the third column having a width in the X direction of one said NAND gate connected in cascade with one said INVERTER gate.

8. A tele-communication system including the arrangement of claim 7.

9. A semiconductor integrated circuit including a fan-in logic tree layout arrangement composed of a plurality N of logic devices, each of such devices having a first and a second input terminal and an output terminal, in which the plurality comprises 1st through 7th such devices sequentially arranged in a first rectangular column, whereby the first column comprises in sequence the 1st through 7th devices,
  the first and second input terminals of the 1st, 3rd, 5th, and 7th devices are separately connected by respective wirings of mutually substantially equal lengths to receive signals emanating from 1st, 2nd, 3rd and 4th sources, respectively, that are external to all of the N devices and that are sequentially arranged in a second rectangular column parallel to the first column, whereby the second column comprises in sequence the 1st through 4th sources,
  the output terminals of the 1st and the 3rd devices are separately connected by respective wirings of substantially equal lengths to the first and second input terminals, respectively, of the 2nd device,
  the output terminals of the 5th and 7th devices are separately connected by respective wirings of substantially equal lengths to the first and second input terminals, respectively, of the 6th device, the output terminals of the 2nd and 6th devices are connected by wirings of substantially equal lengths to the first and second input terminals, respectively, of the 4th device, the first and second input terminals of the 1st, 3rd, 4th, 5th, and 7th devices, as well as the output terminals of the 2nd and 6th devices, are all located essentially on a first side of the first column, and the first and second input terminals of the 2nd and 6th devices, as well as the output terminals of the 1st, 3rd, 4th, 5th, and 7th devices, are all located essentially on a second side of the first column opposite the first side thereof.

10. The circuit of claim 9 in which all of the 1st through 7th such logic devices are mutually substantially identical in structure.

11. The circuit of claim 10 in which each of the 1st through 7th devices consists essentially of a two-input NAND gate and a single-input inverter, the output terminal of the NAND gate being connected to the input terminal of the inverter.

12. The circuit of claim 9 in which the plurality N further comprises 8th through 15th such devices sequentially arranged in the first column, whereby the first column comprises in sequence the 1st through 15th such devices, the first and second input terminals of the 9th, 11th, 13th, and 15th devices are separately connected to receive signals emanating from 5th, 6th, 7th, and 8th sources, respectively that are external to all of the N devices and that are sequentially arranged in the second column, whereby the second column comprises in sequence the 1st through 8th sources, the output terminals and the first and second input terminals of the 9th through 15th devices are connected among one another in the same way as the output terminals and the first and second input terminals, respectively, of the 1st through 7th devices are connected to one another, the output terminals of the 4th and 12th devices are separately connected to first and second input terminals, respectively, of the 8th device, the first and second input terminals of the 9th, 11th, 12th, 13th, and 15th devices, as well as the output terminals of the 8th, 10th and 14th devices, are all located essentially on the first side of the first column, and the first and second input terminals of the 8th, 10th, and 14th devices, as well as the output terminals of the 9th, 11th, 12th, 13th, and 15th devices are all located essentially on the second side of the first column.

13. The circuit of claim 12 in which all the logic devices are mutually substantially identical.

14. The circuit of claim 13 in which each of the 1st through 15th devices consists essentially of a two-input NAND gate and a single-input inverter, the output terminal of the NAND gate being connected to the input terminal of the inverter.

* * * * *